United States Patent
Currie et al.

(10) Patent No.: US 7,331,532 B2
(45) Date of Patent: Feb. 19, 2008

(54) ACOUSTIC NOISE REDUCTION USING FAN SPEED CONTROL

(75) Inventors: Thomas Currie, Ottawa (CA); John Clayton Atkinson, Ottawa (CA); Marko Nicolici, Ottawa (CA); Amrish Patel, Kanata (CA); Ken McFarlane, Gloucester (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 660 days.

(21) Appl. No.: 10/864,007

(22) Filed: Jun. 9, 2004

(65) Prior Publication Data

US 2005/0275365 A1    Dec. 15, 2005

(51) Int. Cl.
*F24F 7/00* (2006.01)
*G05D 23/00* (2006.01)

(52) U.S. Cl. .................. 236/49.3; 318/471; 318/472; 700/299; 700/300

(58) Field of Classification Search ............... 236/49.3, 236/DIG. 9; 62/186; 700/299, 300, 277, 700/278; 361/695, 688, 687; 318/471, 268, 318/472
See application file for complete search history.

(56) References Cited

U.S. PATENT DOCUMENTS 4,817,865 A * 4/1989 Wray .................. 236/49.3
5,484,012 A * 1/1996 Hiratsuka .................. 165/247
5,777,897 A   7/1998 Giorgio
6,037,732 A   3/2000 Alfano et al.
6,188,189 B1 * 2/2001 Blake .................. 318/471

* cited by examiner

*Primary Examiner*—Chen-Wen Jiang
(74) *Attorney, Agent, or Firm*—Ridout & Maybee LLP

(57) ABSTRACT

A method and apparatus is disclosed for acoustic noise reduction using fan speed control. The acoustic noise reduction using fan speed control includes a plurality of temperature detectors disposed at a plurality of locations within an electronics equipment enclosure, each detector having an associated setpoint temperature. An error value is determined for each temperature detector, the error consisting of the difference between the detected temperature and the associated setpoint temperature. The maximum error among all error values is then identified and the operating speed of a cooling fan in is set in response to this maximum error. Advantages include providing a fan speed directly related to electronics temperature which inherently accounts for higher ambient temperatures, enclosure altitude, electronics power consumption, and air filter clogging. The acoustic noise reduction using fan speed control is particularly useful for overcoming the need to overcompensate fan speed, thereby resulting in higher than necessary noise levels in order to accommodate worse-case conditions known in the art.

23 Claims, 2 Drawing Sheets

ACOUSTIC NOISE REDUCTION USING FAN SPEED CONTROL

FIELD OF THE INVENTION

The present invention relates to acoustic noise reduction using fan speed control and is particularly concerned with reducing cooling air flow velocities while ensuring that thermally critical areas do not overheat as a result of the reduced flow.

BACKGROUND OF THE INVENTION

As the functionality and bandwidth of communications networks continues to increase, the power dissipation of the network elements continues to rise concurrently. This has resulted in the use of larger forced-air thermal management systems to cool this equipment which consume more power and generate increasing levels of acoustic noise. These issues have become an area of concern for some customers.

Aerodynamic noise in a fan-cooled enclosure for electronics constitutes a difficult to eliminate noise source since it is generated by a material flow necessary for cooling the electronics. Reduction of flow rates carries the associated risk of inadequate cooling resulting in equipment damage, failure, or shortened operational life.

Noise attenuation approaches via absorption, for example with foam or other acoustic deadening insulation, are generally not possible due to space limitations within and surrounding the enclosure. Design practices which seek to eliminate particular aerodynamic noise sources such as sharp corners, edges, and cavities, are not practical or cost-effective for sheet metal enclosures intended to maximize the interior space available for electronics. Modifications to the fans via provision of serrated trailing edges on impeller blades and turbulence generators do not provide significant noise reduction unless taken to the extent that air delivery performance of the impeller is compromised.

As disclosed in U.S. Pat. No. 5,777,897 (1998) to Giorgio, brushless direct current (DC) fans lend themselves to cooling applications where it is desirable to control the fan speed. The speed and resulting airflow of DC fans is proportional to the applied voltage, therefore the fan speed may be reduced when cooling requirements lessen. Giorgio goes on to disclose a control system which matches fan speed to ambient temperature and electrical load for a system, based upon the premise that an increase in either will necessitate an increase in fan speed, whereas a drop in either would allow the fans to function at a lower, therefore quieter, level. A problem with this approach may be the need to set the fan power according to the worse-case conditions for cooling context, such as dirty air filter, highest altitude, and worse-power card in order to ensure that the fan speed is adequate for these operating conditions.

U.S. Pat. No. 5,484,012 (1996) to Hiratsuka discloses an electronic system with two fans. The electronic apparatus to be cooled is located in a housing having an intake port and an exhaust port. A cooling fan is mounted in the exhaust port, and an auxiliary cooling fan is placed near the electronic apparatus generating the heat within the housing. A first control subsystem controls the fan speed for the exhaust cooling fan in accordance with the temperature of the incoming air, and a second control subsystem controls the speed of the auxiliary cooling fan. The second control subsystem imposes a high speed on the auxiliary fan when the exhaust fan is running at a low speed, and imposes a low speed or stopped state on the auxiliary fan when the exhaust fan is running at a high speed. By reducing or eliminating the rotation of the auxiliary fan, noise is reduced. As outlined for the Giorgio disclosure, a problem with this approach may be the need to have the first control subsystem operate the cooling fan at a speed appropriate for worse-case conditions at a given ambient temperature in order to ensure that the fan speed is sufficient for those conditions.

U.S. Pat. No. 6,037,732 (2000) to Alfano et al. discloses a method for power management in a fan cooled system by controlling the operation of a brushless DC fan according to the temperature of a system. If the system temperature is below a certain value, the fan is shut down or operated at a minimum speed, and for temperatures above the certain value the fan is run at a speed proportional to the system temperature. The net result is to conserve power consumed by the fan motor. A problem with this approach may be the use of system temperature, a temperature which may not reflect the hottest or most thermally stressed component in a given operating state.

In view of the foregoing, it would be desirable to provide a technique for acoustic noise reduction by fan speed control which overcomes the above-described inadequacies and shortcomings by providing a mechanism which does adjust fan speed according to the operating conditions and needs of thermally sensitive components but does not need to overcompensate to accommodate worse-case conditions.

SUMMARY OF THE INVENTION

An object of the present invention is to provide an improved cooling system having acoustic noise reduction using fan speed control.

In accordance with the invention, a fan speed control system is provided for an electronic equipment enclosure that comprises a plurality of temperature detecting means. Each of the temperature detecting means has an associated setpoint temperature. The temperature detecting means are disposed at a plurality of locations throughout the enclosure. Further, there are means for determining an error value for each of the plurality of temperature detecting means, with error value being the difference between a temperature detected at that temperature detecting means and the associated setpoint temperature. In addition, there is a means for determining the maximum error among the plurality of error values; and a means for setting the operating speed of the cooling fan or fans in response to the maximum error.

Advantages of the present invention include provision of a fan speed directly related to electronics temperature which inherently accounts for higher ambient temperatures, enclosure altitude, electronics power consumption, air filter clogging, or reduced airflow due to other causes. In addition, card-specific temperature set points yield a lowest fan speed and associated noise level based on electronic circuit pack fill within the enclosure.

Conveniently the plurality of temperature detection means are disposed proximate to temperature sensitive components. Advantageously, the apparatus may also have a temperature band associated with the setpoints wherein a fan is set to operate at a minimum speed at temperatures detected at or below the bottom of the band, and at a maximum speed at temperatures detected at or above the top of the band. Conveniently the temperature band may be generally centered on the setpoint temperature, and a linear proportional fan speed set for temperatures within the temperature band.

Advantageously, the apparatus may operate so as to poll the plurality of temperature detecting means at intervals.

Conveniently, a hysteresis temperature band may be used so that a current fan speed is maintained if a current maximum error is within the hysteresis temperature band of the maximum error of a previous poll. A result is a constant fan speed for cyclical variations in ambient temperature having an amplitude less than the specified hysteresis, due for example, to on/off cycling of an air conditioning system. Also advantageously, the maximum error may be filtered, conveniently by an exponentially weighted filter using in part the maximum error of the previous polls, so as to dampen the response of the controller to error variations.

In accordance with another aspect of the present invention there is provided a method for reducing aerodynamic acoustic noise generated by at least one cooling fan for an electronics equipment enclosure, having the steps of sampling a plurality of temperature detecting means disposed at a plurality of locations within the electronics equipment enclosure, each of said plurality of temperature detecting means having an associated setpoint temperature. Then, determining an error value for each of the plurality of temperature detecting means, the error value being the difference between a temperature detected at that temperature detecting means and the associated setpoint temperature. Next, determining the maximum error among the plurality of error values; and then setting the operating speed of the at least one cooling fan in response to the maximum error.

Advantageously, there may be a temperature band associated with the setpoint temperatures and the step of setting the operating speed may have a further step of associating the operating speed with the temperature band. Conveniently, the temperature band may be generally centered on the setpoint temperature. Advantageously, the associating step may associate temperatures at or below the lower end of the temperature band with a minimum fan speed, and temperatures at or above the upper end of the temperature band with a maximum fan speed.

Conveniently, the sampling step may be performed at a polling interval. Advantageously a hysteresis temperature band may be associated with the maximum error, and the step of setting the operating speed may have the further step of maintaining the operating speed at a current setting if the maximum error on a current poll is within the hysteresis temperature band of the maximum error that was used to set the current speed.

Advantageously, a filtering step may be provided for filtering the maximum error. Conveniently, the filtering step may use an exponentially weighted filter using in part the filtered maximum error of an immediately previous poll, or a plurality of previous polls.

The present invention will now be described in more detail with reference to exemplary embodiments thereof as shown in the appended drawings. While the present invention is described below with reference to the preferred embodiments, it should be understood that the present invention is not limited thereto. Those of ordinary skill in the art having access to the teachings herein will recognize additional implementations, modifications, and embodiments which are within the scope of the present invention as disclosed and claimed herein.

BRIEF DESCRIPTION OF THE DRAWINGS

The invention will be further understood from the following detailed description of embodiments of the invention and accompanying drawings in which.

DETAILED DESCRIPTION

Figure 1:
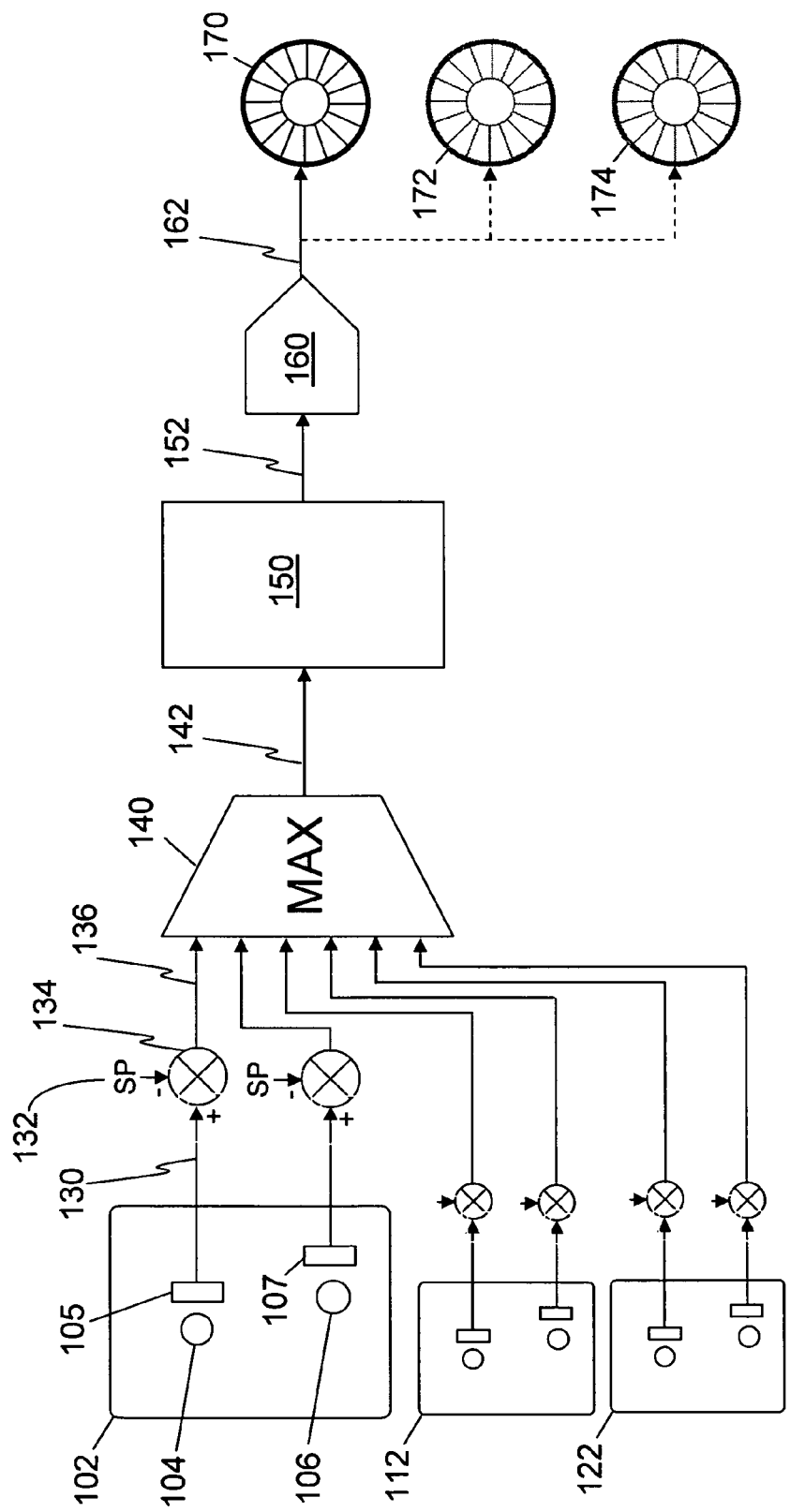
FIG. 1 is a diagram of an fan control system according to an embodiment of the invention.

Referring to FIG. 1 there may be seen a fan control system according to an embodiment of the invention. Electronic equipment circuit board 102 has temperature sensitive electronic components 104 and 106. In close proximity to components 104 and 106 are respective temperature measuring devices 105 and 107. These devices typically comprise temperature measurement integrated circuits which provide a digital output indicating the temperature. A temperature resolution of 0.5° C. provides a satisfactory performance. The temperature output of measurement device 105 is communicated at 130 to a differencer 134. Communication 130 may be a dedicated signalling line or a common bus. Differencer 134 also accepts setpoint value 132 and operates by determining the difference between the temperature communicated at 130 and setpoint value 132 to generate an error value 136. The error value 136 is provided to a maximum error determining means 140.

As may be seen in FIG. 1, further electronic circuit cards 112 and 122 also provide temperature measurement outputs to respective differencers, and the resulting error values are also communicated to maximum error determining means 140. This maximum error determining means 140 may be, for example, a comparator used to determine the maximum error from among the plurality of errors from the differencers, or may be a software routine function making the same determination. FIG. 1 portrays a electronics system with three circuit cards each having a pair of temperature measuring devices, however it is to be understood that this is illustrative only. Typical installations could have any number of circuit cards appropriate to the particular application. Further, although two temperature measurement devices per circuit card provides a degree of redundancy, it is contemplated that a greater number of measurement devices may be used when particular circuit cards possess a greater number of temperature sensitive components, for example in a telecommunications system having a plurality of optical laser transceivers. Conversely, it is also apparent that circuit cards may have but a single measurement device, for example in applications where all the components have a similar sensitivity temperature sensitivity and the temperature distribution across the circuit card is uniform.

The setpoint value 132 will be predetermined in conjunction with the thermal sensitivity of the component 104 which it is specifically associated with. The setpoint value in general will take into account factors such as maximum permitted temperature for the component, as well as the difference between the temperature measured by the respective temperature measuring device and the temperature of the component of interest. This difference may be established by thermal modelling techniques known to those skilled in the art, or alternatively derived via measurements taken upon a representative operating system.

Maximum error determining means 140 and differencer 134 are representative of functional blocks and may be provided by discrete functional blocks or alternatively by elements of a controller executing software providing the equivalent functionality.

Maximum error determining means 140 communicates the maximum error of all the errors determined via link 142 to controller 150. In the case where the measured temperatures exceed the associated setpoint temperature, the maximum error will be the temperature difference of that device which most exceeds its setpoint temperature. As can be recognized, this is representative of the temperature of the component potentially most in need of cooling at that particular instance in time. This need of cooling may be due to a number of factors, including increased ambient air temperature, the effects of increased altitude on the thermal dissipation of that particular component, or possibly compromises to the cooling air flow reaching that component due air filter clogging, or the presence of another circuit card acting to inhibit air flow.

The utility of identifying the maximum error in a fan control system as contemplated in this embodiment is that it indirectly takes into account those thermal factors which may require a change in fan speed by taking its cue from both the components of interest, and the component most in need.

Returning to FIG. 1, the controller 150 having obtained the maximum error can proceed to determine an appropriate fan speed, or fan speed change. Upon the conclusion of its determination, the controller 150 will direct Digital-to-Analog Converter (DAC) 160 via link 152 to drive the fan 170 at the determined speed setting. As represented in FIG. 1, the determination may be used to control a plurality of fans indicated generally at 170, 172, and 174.

One method of determination which could be used by controller 150 is a linear proportional algorithm.

Figure 2:
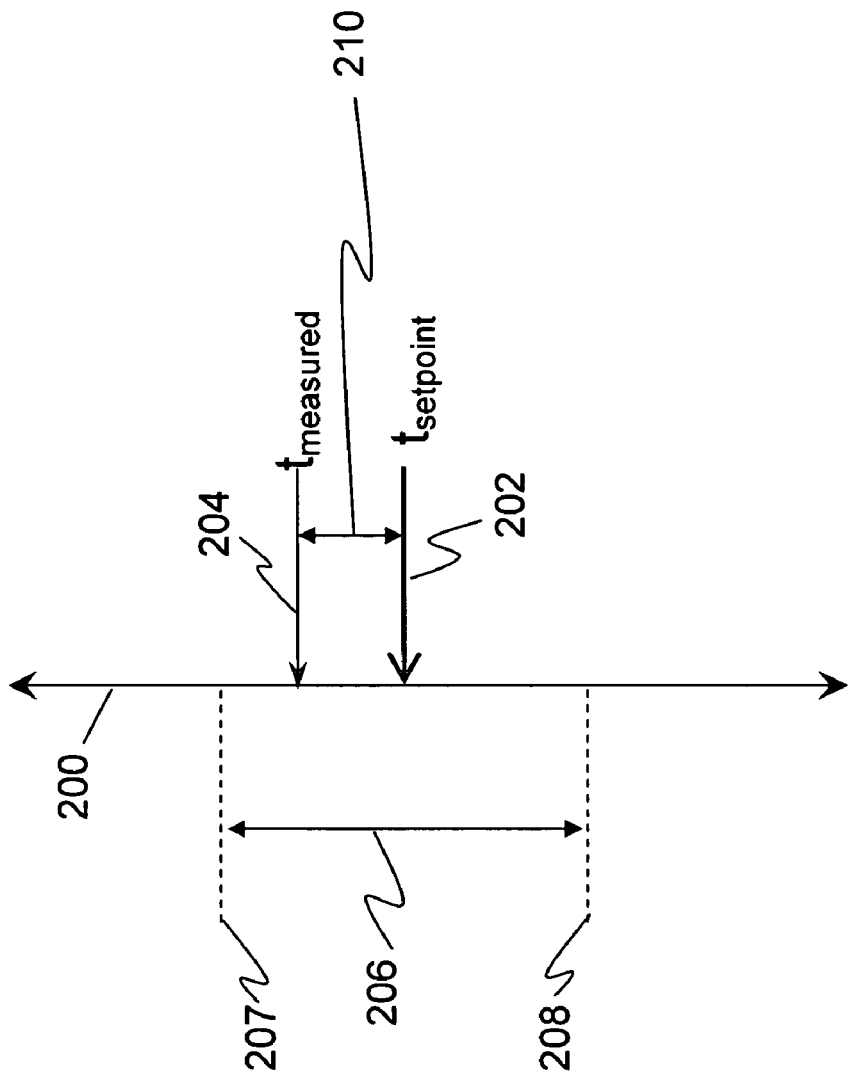
FIG. 2 is a diagram illustrating the relation between temperatures and temperature bands used in the fan control system according to an embodiment of the invention.

Referring to FIG. 2, there may be seen a diagram setting forth a set of temperature relations. Axis 200 represents a conventional temperature scale wherein increasing temperatures are representing higher on the scale. A setpoint temperature $t_{setpoint}$ 202 is indicated on axis 200. A temperature representative of the output of a temperature measurement device, denoted $t_{measuredt}$ 204 may be seen on axis 200. As $t_{measuredt}$ 204 is higher than $t_{setpoint}$ 202, this configuration is potentially representative of a system state requiring greater cooling. The difference 210 between $t_{measuredt}$ 204 and $t_{setpoint}$ 202 corresponds to the error value referred to previously. Referring to the left side of axis 200 there may be seen a temperature interval or temperature bound 206. The temperature bound 206 has an upper temperature 207 and a lower temperature 208.

Temperature bound 206 is generally conceived as a control range over which fan speed is to be varied. A single temperature bound may be used in a controller for all setpoints. In such an embodiment, the temperature bound would represent a control region around a particular setpoint, or conversely, the temperature range within which the control system seeks to maintain the temperature. It is important to note that a single bound does not represent a single unique absolute temperature range. Instead, as the temperature bound is associated with the particular setpoint associated with each component, the combination of bound and setpoint results in a plurality of temperature ranges. This plurality provides a flexibility which cannot be afforded by control systems which measure incoming ambient or outgoing exhaust air. Additionally, as outlined above, at any given instant, the fan control system will be operating so as to control the temperature of that component most in need of control, resulting in a minimum fan speed (and thus noise) while still providing acceptable cooling for the components.

Returning to FIG. 2, in one contemplated embodiment, temperature bound 206 is generally centered about $t_{setpoint}$ 202, providing a symmetrical temperature band above and below $t_{setpoint}$ 202. In this particular embodiment, the controller 150 would set the fan speed to a minimum setting for temperatures at or below the lower bound 208, and set the fan speed to a maximum setting for temperatures at or above the upper bound 207. Between upper bound 207 and lower bound 208 controller 150 would set fan speed linearly proportionally to the relative point within the temperature band. For example, with a symmetrically distributed temperature bound, the fan speed would be set midway between its minimum and maximum speeds at when the measured temperature coincided with the setpoint temperature.

In the embodiment contemplated above, the algebraic expression describing a simple linear proportional control algorithm for controller 150 is as follows:

$$FS_{setting} = FS_{min} + \left(E_{max} + \frac{t_{bound}}{2}\right)\frac{(FS_{max} - FS_{min})}{t_{bound}}$$

where:
  $FS_{setting}$ represents a determined fan speed setting
  $FS_{min}$ represents the minimum fan speed setting
  $FS_{max}$ represents the maximum fan speed setting
  $E_{max}$ represents the maximum error of all sampled errors
  $t_{bound}$ represents the temperature bound
with:
  $FS_{setting} = FS_{min}$ for fan speed results less than $FS_{min}$; and
  $FS_{setting} = FS_{max}$ for fan speed results greater than $FS_{max}$.

Considered as a proportional controller, it can be seen that $t_{bound}$ effectively defines the gain of the controller with smaller values giving a higher controller gain. Generally, $t_{bound}$ is set to a level sufficient to provide stable operation given system time constants. A value for $t_{bound}$ of 6° C. has been found to result in stable operation.

Stability of the fan control system can be enhanced by a number of other measures, in particular filtering of the maximum error and the use of a hysteresis band.

Under an embodiment of the invention, sampling of temperature measurement devices occurs repetitively at polling intervals. By retaining successive values of $E_{max}$, a filtered value $\overline{E}_{max}$ may be calculated. Conveniently an exponential weighted moving average (EWMA) filter may be used. This may generally be represented by an expression of the form:

$$\overline{E}_i = \alpha E_i + (1-\alpha)\overline{E}_{i-1}$$

where:
  $\overline{E}_i$ represents the desired filtered $E_{max}$ at polling time i
  $E_i$ represents the measured $E_{max}$ at polling time i
  $\overline{E}_{i-1}$ represents the filtered $E_{max}$ at polling time i−1 (i.e. the previous poll)
  α represents a filtering relaxation gain By employing an EWMA filter in association with successive $E_{max}$ values, measurements indicated that stable system operation could be achieved for $t_{bound}$ values as low as 2° C. Typical values for α range from 0.25 to 0.50, however other values could be used in particular applications.

A hysteresis band may also be employed in association with successive $E_{max}$ values (filtered or otherwise). The hysteresis band may be used to ensure that if successive $E_{max}$ values are within the hysteresis band surrounding the value of $E_{max}$ used to set the current fan speed, then no change to fan speed setting is to occur.

The hysteresis band may be used to effectively ignore periodic variations in ambient temperature. This is advantageous in order to avoid component temperature swings due to fan speed variation which would be in excess of the temperature swings due to the perturbing variations in ambient. The hysteresis should be set so that the controller will ignore peak-to-peak variations of ambient which might occur due to air conditioning cycling on/off for example. A useful value for a hysteresis setting has been found to be 1.7° C., with such a setting meaning that the fan control system will not change fan speed for peak-to-peak variations in ambient less than approximately 3.4° C.

A sampling interval of on the order of 60 seconds has been found to be effective.

A pseudocode representation of a fan controller algorithm according to an embodiment of the invention may be found in the Appendix. The fan controller algorithm of this embodiment of the invention includes temperature bounds, EWFA filtering and hysteresis bands.

The fan control algorithm of this embodiment is used to control a 4-bit DAC, and as a result the output of the controller uses Integer Speed Numbers (ISNs). A 4-bit DAC is capable of handling a total of 16 speed settings ranging from value 0 to 15. Value 0 implies fan stop, and as well, lower values typically do not generate sufficient voltage for reliable fan operation. As such, an $ISN_{min}$ value is established, representing a lower speed limit to which the fan will be set. An upper speed limit, $ISN_{max}$, represents the maximum fan speed setting, and is used as an upper bound in calculations.

The controller algorithm of this embodiment does not directly calculate a fan speed setting, instead it calculates a change in speed or ΔISN and adds this change in speed to the previous fan speed setting. The term $ISN_{jump}$ represents the maximum change permitted and typically assumes a value of 1 or 2. The larger value is chosen when fewer fan speeds are desired.

Two functions, $F_{integer}$ and $F_{sign}$ are used in the pseudocode. $F_{integer}$ represents the integer value of the expression of interest, and $F_{sign}$ represents the sign value of the expression of interest. Of particular importance is the use of the $F_{integer}$ function in the step wherein ΔISN is calculated as the use of this function precludes the possibility of an ΔISN occurring which would be larger than the corresponding non-integer ΔSN. That is, for stability reasons it is undesirable to have a speed increment of some fractional amount rounded up to a larger speed increment.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

APPENDIX

Pseudocode for Performing Fan Speed Control

Repeat the following every polling interval:
  Sample temperature at sensors
  Calculate errors $E_1, E_2, \ldots, E_n$ for n sensors
    $E = t_{sensor} - t_{setpoint}$
  Find maximum observed error among set of sensor errors
    $E_{max} = max(E_1, E_2, \ldots, E_n)$
  Filter the maximum observed error
    $E_{average} = \alpha * E_{max} + (1 - \alpha) * E_{average(previous)}$
  If | $E_{average} - E_{last}$ | < HYSTERESIS
    then proceed to end of polling interval speed change loop
    If $E_{average} > E_{last}$,
      then HYST = HYSTERESIS
      else HYST = -HYSTERESIS
  Compute fan speed increment
    ΔISN = $ISN_{jump} * F_{integer}[(E_{average} - E_{last} - HYST)*(ISN_{max} - ISN_{min})/(t_{bound} * ISN_{jump})]$
  Test to see if computed speed change is excessive
    If | ΔISN | > $ΔISN_{max}$, then set ΔISN = $F_{sign}[ΔISN] * ΔISN_{max}$
  Calculate incremented fan speed
    ISN = ISN + ΔISN
  Ensure fan speed setting is within limits
    for minimum speed: If ISN < $ISN_{min}$, then ISN = $ISN_{min}$
    for maximum speed: If ISN > $ISN_{max}$, then ISN = $ISN_{max}$
  If speed has changed, then update $E_{last}$
    If | ΔISN | > 0
      then $E_{last}$ = (ISN - $ISN_{min}$ - $ISN_{jump}$)*$t_{bound}$/($ISN_{max}$ - $ISN_{min}$) - 0.5*$t_{bound}$
  Propagate new speed settings to appropriate fan controller DACs
End of polling interval speed change loop

What is claimed is:

1. A system for reducing aerodynamic acoustic noise generated by at least one cooling fan for an electronics equipment enclosure, the system comprising:
  a plurality of temperature detecting means disposed at a plurality of locations within said electronics equipment enclosure, each of said plurality of temperature detecting means having an associated setpoint temperature;
  a means for determining an error value for each of said plurality of temperature detecting means, said error value being the difference between a temperature detected at that temperature detecting means and said associated setpoint temperature, thereby determining a plurality of error values;
  a means for determining a maximum error among the plurality of error values; and
  a means for setting an operating speed of said at least one cooling fan based on said maximum error.

2. The apparatus of claim 1 wherein at least one of said plurality of locations is proximate to a temperature sensitive component.

3. The apparatus of claim 1 further comprising:
  a temperature band associated with each said associated setpoint temperature,
  wherein said means for setting the operating speed operates to associate the operating speed of said at least one cooling fan with said temperature band.

4. The apparatus of claim 3 wherein said temperature band is disposed generally centered on said associated setpoint temperature.

5. The apparatus of claim 4 wherein said means for setting the operating speed operates to associate temperatures at or below a lower end of said temperature band with a minimum fan speed.

6. The apparatus of claim 5 wherein said means for setting the operating speed operates to associate temperatures at or above an upper end of said temperature band with a maximum fan speed.

7. The apparatus of claim 6 wherein said means for setting the operating speed operates to provide a linear increase in fan speed across said temperature band.

8. The apparatus of claim 7 wherein said means for setting the operating speed operates by polling said plurality of temperature detecting means at intervals.

9. The apparatus of claim 8 wherein said means for setting the operating speed operates to maintain the operating speed of said at least one cooling fan at a current setting in the event that the maximum error on a current poll is within a hysteresis temperature band of the maximum error of a previous poll.

10. The apparatus of claim 8 further comprising means for filtering said maximum error to produce a filtered maximum error.

11. The apparatus of claim 10 wherein said means for filtering said maximum error filters said maximum error according to an exponentially weighted filter using in part the filtered maximum error of an immediately previous poll.

12. A method for reducing aerodynamic acoustic noise generated by at least one cooling fan for an electronics equipment enclosure, the method comprising:
sampling a plurality of temperature detecting means disposed at a plurality of locations within said electronics equipment enclosure, each of said plurality of temperature detecting means having an associated setpoint temperature;
determining an error value for each of said plurality of temperature detecting means, said error value being the difference between a temperature detected at that temperature detecting means and said associated setpoint temperature, thereby determining a plurality of error values;
determining a maximum error among the plurality of error values; and
setting an operating speed of said at least one cooling fan based on said maximum error.

13. The method of claim 12 wherein at least one of said plurality of locations is proximate to a temperature sensitive component.

14. The method of claim 12 wherein there is a temperature band associated with each said associated setpoint temperature and wherein said setting the operating speed further comprises associating the operating speed of said at least one cooling fan with said temperature band.

15. The method of claim 14 wherein said temperature band is disposed generally centered on said associated setpoint temperature.

16. The method of claim 15 wherein said setting the operating speed further comprises associating temperatures at or below a lower end of said temperature band with a minimum fan speed.

17. The method of claim 16 wherein said setting the operating speed further comprises associating temperatures at or above an upper end of said temperature band with a maximum fan speed.

18. The method of claim 17 wherein said setting the operating speed provides a linear increase in fan speed across said temperature band.

19. The method of claim 18 wherein said sampling is performed at a polling interval.

20. The method of claim 19 wherein said setting the operating speed further comprises:
maintaining the operating speed of said at least one cooling fan at a current setting in the event that the maximum error on a current poll is within a hysteresis temperature band of the error corresponding to the current fan speed.

21. The method of claim 19 further comprising filtering said maximum error.

22. The method of claim 21 wherein said filtering uses an exponentially weighted filter using in part the filtered maximum error of the immediately previous poll.

23. An article of manufacture for controlling a data flow in a data network, the article of manufacture comprising:
at least one processor readable carrier and instructions carried on the at least one carrier; wherein the instructions are configured to be readable from the at least one carrier by at least one processor and thereby cause the at least one processor to operate so as to reduce aerodynamic acoustic noise generated by at least one cooling fan for an electronics equipment enclosure by:
sampling a plurality of temperature detecting means disposed at a plurality of locations within said electronics equipment enclosure, each of said plurality of temperature detecting means having an associated setpoint temperature;
determining an error value for each of said plurality of temperature detecting means, said error value being the difference between a temperature detected at that temperature detecting means and said associated setpoint temperature thereby determining a plurality of error values;
determining the maximum error among the plurality of error values; and
setting the operating speed of said at least one cooling fan based on said maximum error.

* * * * *